(12) United States Patent
Kato

(10) Patent No.: US 7,511,422 B2
(45) Date of Patent: Mar. 31, 2009

(54) ORGANIC ELECTROLUMINESCENT ELEMENT WITH SPECIFIC STRUCTURE CONNECTING LUMINESCENT REGIONS AND ORGANIC ELECTROLUMINESCENT DEVICE INCLUDING THE SAME

(75) Inventor: Yoshifumi Kato, Kariya (JP)

(73) Assignee: Kabushiki Kaisha Toyota Jidoshokki, Kariya-Shi (JP)

( * ) Notice: Subject to any disclaimer, the term of this patent is extended or adjusted under 35 U.S.C. 154(b) by 361 days.

(21) Appl. No.: 10/955,885

(22) Filed: Sep. 30, 2004

(65) Prior Publication Data
US 2005/0073251 A1    Apr. 7, 2005

(30) Foreign Application Priority Data
Oct. 2, 2003   (JP) .............................. 2003-344874

(51) Int. Cl.
*H05B 33/00*  (2006.01)
*H05B 33/06*  (2006.01)

(52) U.S. Cl. .................. 313/506; 313/504; 313/512; 428/690; 428/917

(58) Field of Classification Search ................ None
See application file for complete search history.

(56) References Cited

U.S. PATENT DOCUMENTS

2002/0110703 A1 * 8/2002 Tada et al. .................. 428/690
2002/0190661 A1   12/2002 Duggal et al.
2003/0111957 A1 * 6/2003 Kim et al. .................... 313/609
2004/0032220 A1 * 2/2004 Cok et al. .................... 315/291
2005/0052124 A1 * 3/2005 Hieda et al. ................. 313/504
2005/0156520 A1 * 7/2005 Tanaka et al. ............... 313/512

FOREIGN PATENT DOCUMENTS

| JP | 03274694 A   | * | 12/1991 |
| JP | 5-20294      |   | 3/1993  |
| JP | 5-315073     |   | 11/1993 |
| JP | 11-040362    |   | 2/1999  |
| JP | 11-111450    |   | 4/1999  |
| JP | 11-339960    |   | 12/1999 |
| JP | 2000123978 A | * | 4/2000  |
| JP | 2000-173771  |   | 6/2000  |
| WO | WO 02037580 A1 | * | 10/2002 |

OTHER PUBLICATIONS

Seizo Miyata, "Organic EL Element and Forefront of its Industrialization"; Translation of Fig 9, p. 47, Nov. 30, 1998.

* cited by examiner

*Primary Examiner*—Sikha Roy
(74) *Attorney, Agent, or Firm*—Locke Lord Bissell & Liddell LLP

(57) ABSTRACT

An organic electroluminescent element includes a plurality of luminescent regions. Each luminescent region has a first electrode that is transparent and a second electrode. Each luminescent region has an organic layer that is sandwiched between the first electrode and the second electrode for emitting light. The first electrodes are physically adjacently located. An insulation portion is provided between each of the first electrodes. The plurality of luminescent regions are electrically and serially connected.

11 Claims, 10 Drawing Sheets

ORGANIC ELECTROLUMINESCENT ELEMENT WITH SPECIFIC STRUCTURE CONNECTING LUMINESCENT REGIONS AND ORGANIC ELECTROLUMINESCENT DEVICE INCLUDING THE SAME

BACKGROUND OF THE INVENTION

The present invention relates to an organic electroluminescent element in which an organic layer is sandwiched by a pair of electrodes, and to an organic electroluminescent device including the organic electroluminescent element on a substrate.

Conventionally, a display and a lighting unit that use an organic electroluminescent element (hereinafter referred to as an organic EL element) have been proposed. The organic EL element has a structure in which an organic layer including an organic luminescent material is sandwiched between a pair of electrodes.

However, even if the above structure is utilized, the organic EL element is not always completed. For example, at least one of the electrodes injecting an electric carrier (a hole or an electron) to the organic layer also needs to have transparency (transmission function) with respect to light emitted at an organic luminescent region for emitting the light. The organic layer needs to be made of a material that transfers the electric carriers injected from the electrode, that generates an excited state by recombining the electric carriers, and that emits light upon returning from the excited state to a ground state. Thus, the material for forming the organic EL element is extremely limited, and there were no choices other than using a material having high electrical resistivity for forming a transparent electrode and the organic layer in most cases. Therefore, there arises a problem that electric current density in the organic layer varies from a position to another. The following will describe the mechanism.

Generally, the electrode on a light emitting side, from which the light is emitted to the outside of the organic EL element, is made of a material having high electrical resistivity such as ITO (Indium Tin Oxide), and the other electrode is made of material whose electrical resistivity is negligible in comparison to that of the electrode on the light emitting side. Thus, upon thinking about the electrical resistance along electric current path in the organic EL element, the length of the electric current path passing through the electrode on the light emitting side is dominating.

Based on the above setting, it is obvious that the resistance along the current path passing from the terminal portion of the electrode on the light emitting side to the other electrode through the portion of the organic layer near the terminal portion of the electrode is smaller than that from the terminal portion to the other electrode through the portion of the organic layer far from the terminal portion. Namely, the electric current density in the organic layer at the position near the terminal portion of the electrode on the light emitting side is larger than that in the organic layer at the position far from the terminal portion of the electrode on the light emitting side.

Meanwhile, there is a case that the electrode on a side opposite from the light emitting side is made of material whose electrical resistivity is larger than that of the electrode on the light emitting side. In this case, the above explanation is still valid if the electrode on the light emitting side and the other electrode are interchanged in the above description.

As described above, it is hard to equalize the electric current density in each position of the organic layer in a plane direction. Thus, the following adverse phenomena are likely to occur.

Luminance Nonuniformity

The organic EL element has a spot through which a large amount of the electric current flows and a spot through which a small amount of the electric current flows. Thus, luminance nonuniformity occurs as a whole of the organic EL element. As the amount of the flowing electric current is increased, the luminance of the organic EL element rises (refer to Non-patent reference, P46-47 and FIG. 9, "Organic EL Element and Forefront of its Industrialization" edited by Seizo Miyata of NTS corporation, published on Nov. 30, 1998). Therefore, when the organic EL element has a spot through which a large amount of electric current flows and a spot through which a small amount of electric current flows, the luminance differs between the spots, so that the nonuniformity of the luminance occurs.

Lifetime Difference in Element

The lifetime of the organic EL element differs between the spot through which a large amount of electric current flows and the spot through which a small amount of the electric current flows. Generally, the lifetime of the spot through which a large amount of the electric current flows is short. Thus, there is a spot whose lifetime is short, and the lifetime of the organic EL element is short in comparison to an element through which electric current uniformly flows. Also, due to long periods of use, there appears a spot that does not emits light or a spot whose luminance is lower than that of the other spot.

Degradation

Since the organic EL element has a spot through which a large amount of the electric current flows and a spot through which the small amount of the electric current flows, there is a case that the organic EL element is degraded in some position.

Chromaticity Nonuniformity

Since the organic EL element has a spot through which a large amount of the electric current flows and a spot through which a small amount of the electric current flows, S-S annihilation occurs in an organic EL element containing a fluorescent material, or T-T annihilation occurs in an organic EL element containing a phosphorescent material. Thus, in the organic EL element containing a plurality of fluorescent materials, each emitting light having a color and wavelength different from at least one of the other fluorescent materials, there is a case that the luminance differs between a spot through which the electric current easily flows and a spot through which the electric current poorly flows. As a result, nonuniformity of chromaticity occurs.

To solve such problems, various techniques have been conventionally proposed. For example, there is a technique to equip many terminals to apply a voltage (e.g. refer to Claim 2 and a paragraph [0002] of Japanese Unexamined Patent Publication No. 5-315073). However, since the size of a device, such as a mobile phone with the organic EL element, is limited, the size of the organic EL element is also limited. Namely, in order to enlarge an emitting area of the organic EL element, the total area of the terminal portions need to be reduced. Also, it is necessary to consider the occupation rate of wires that connect the terminals and an external drive circuit. Thus, although the provision of many terminals, as in the conventional technique, is effective to solve the above problems, the conventional technique is hard to practically utilize.

There is known a conventional technique in which an auxiliary electrode made of a material with a low electrical resistivity is arranged in an electrode made of material with a high electrical resistivity. For example, a technique has been proposed in which auxiliary electrodes are respectively arranged at diagonally opposing edge positions between luminescent layers (the above organic layers) and transparent conductive films (the above electrodes) (e.g. refer to Claim 1 of Japanese Unexamined Utility Design Publication No. 5-20294). Although the conventional technique is properly utilized, the above problems are not completely solved.

A conventional technique has been proposed in which variations in in-plane thicknesses of each layer that constitutes an organic layer is set at a predetermined value (e.g. refer to Claim 1 of Japanese Unexamined Patent Publication No. 11-339960). Also, a conventional technique has been proposed in which a thickness of the luminescent layer (organic luminescent region) in an organic layer is adjusted at each position of the luminescent layer so as to equalize luminance in a plane direction (e.g. refer to Claim 2 and FIG. 1 of Japanese Unexamined Patent Publication No. 11-40362). Although these conventional techniques are properly utilized, it is extremely and practically hard to change the thickness of each layer by position upon manufacturing the organic EL element. Also, it is necessary to utilize a special manufacturing method to achieve the change of the thickness of each layer, and it is necessary to develop manufacturing equipment for achieving the manufacturing method.

A conventional technique concerning a line light source has been proposed in which a luminescent region is divided into a plurality of portions and that each luminescent region is serially connected to one another (e.g. refer to paragraphs [0040] through [0046] and paragraph [0060] through [0065] of Japanese Unexamined Patent Publication No. 2000-173771). More specifically, in the conventional technique, a plurality of thin-film luminescent elements (luminescent regions) are serially connected, and the area of each thin-film luminescent element is substantially equalized, thereby equalizing electric current density in each luminescent element. Thus, the luminance of each thin-film luminescent element is equalized. However, although the organic EL element is manufactured according to the embodiment disclosed in the conventional technique, there arises a problem that defects are likely to be manufactured, for example, a cathode and an anode are short-circuited in each luminescent element, or a luminescent region that does not emits light is produced. Also, since regions between the luminescent regions do not emit light, there is a possibility that it appears that there is a non-luminescent region upon utilizing the organic EL element as a surface light source. Namely, if there is a non-luminescent position in a practical product, it could be judged that the product is defective.

SUMMARY OF THE INVENTION

The present invention provides an organic EL element in which electric current density in each position of an organic layer is actually and substantially equalized and that is hard to become a defective. The present invention also provides an organic EL element in which there is not a non-luminescent region or a non-luminescent region is not confirmed by the naked eye when utilized as a surface light source and an element of a display. Furthermore, the present invention provides an organic EL device including the above organic EL element.

According to the present invention, an organic electroluminescent element includes a plurality of luminescent regions. Each luminescent region has a first electrode that is transparent and a second electrode. Each luminescent region has an organic layer that is sandwiched between the first electrode and the second electrode for emitting light. The first electrodes are physically adjacently located. An insulation portion is provided between each of the first electrodes. The plurality of luminescent regions are electrically and serially connected.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF THE PREFERRED EMBODIMENTS

Figure 1:
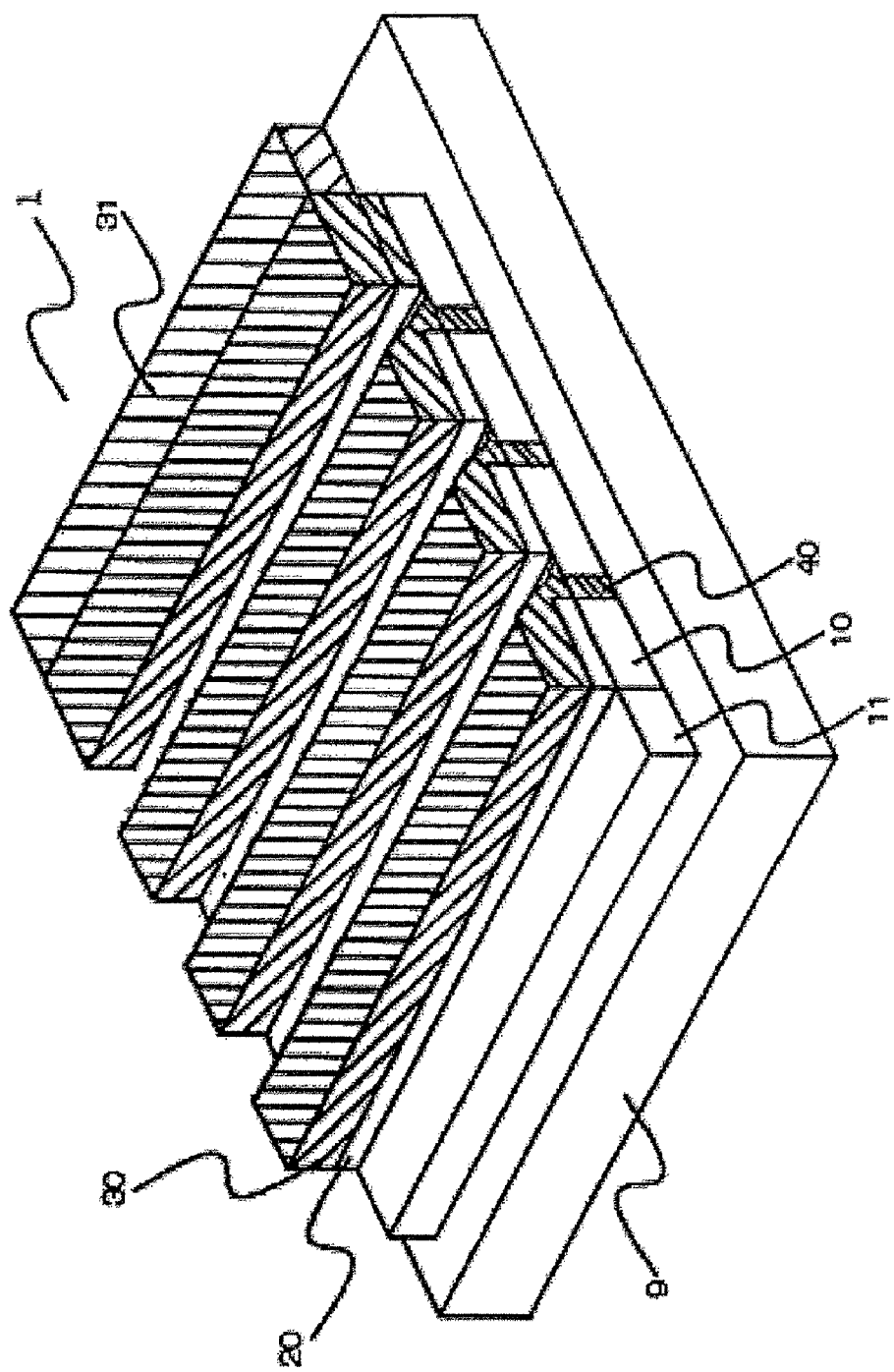
FIG. 1 is a perspective view showing a structure of an organic EL device according to a preferred embodiment of the present invention.

The following will describe an organic EL element according to a preferred embodiment together with an organic electroluminescent device (hereinafter referred to as an organic EL device) with reference to FIGS. 1 through 9C. In FIGS. 1 through 9C, similar or corresponding elements or parts are referred to by similar reference numerals. FIGS. 1 through 9C do not show an actual organic EL element and an actual organic EL device and show schematic views of those structures for explaining those structures, but one or several dimensions are exaggeratedly shown.

The organic EL element is formed on a substrate in the organic EL device according to the preferred embodiment. The organic EL device has a bottom emission structure in which light exits from a side of the substrate. However, it is possible for the organic EL element to have a top emission structure or a structure in which light exits from both the side of the substrate and a side opposite from the substrate. Thus, although the following will mainly describe the organic EL device with the bottom emission, the following will additionally describe the other structures.

Figure 2:
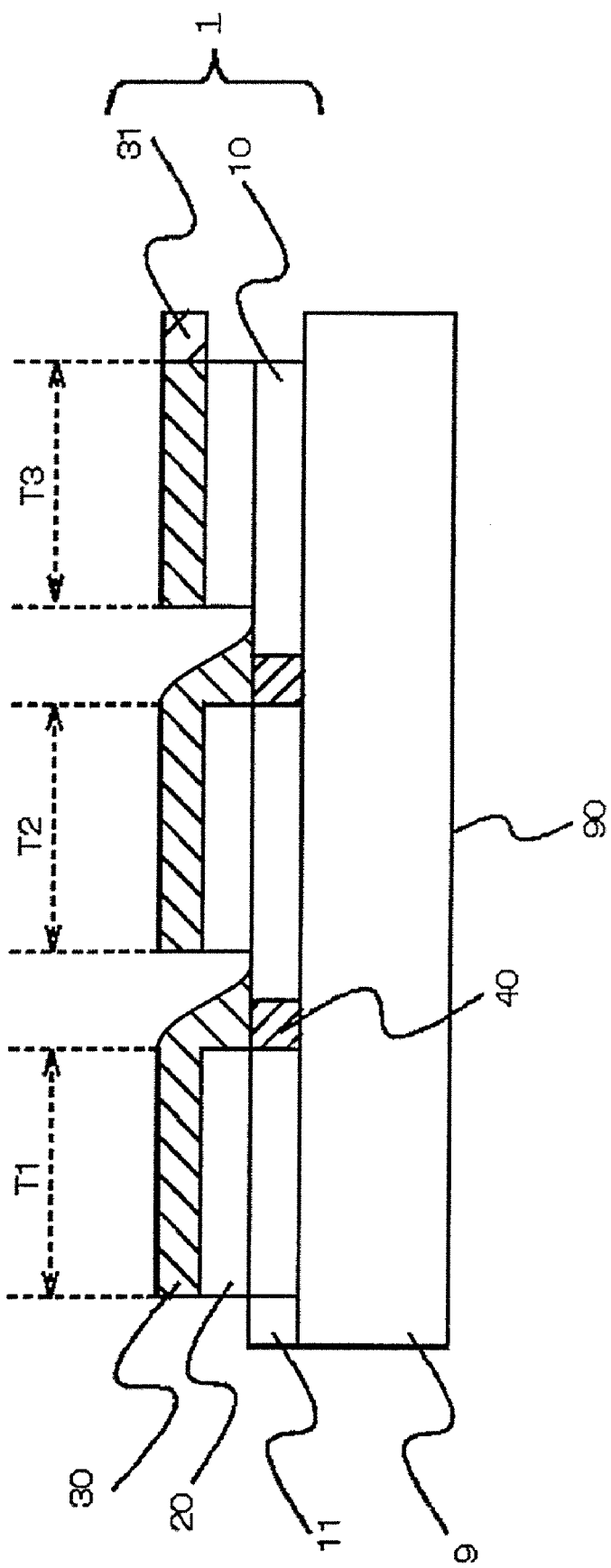
FIG. 2 is a schematic cross-sectional view showing the structure of the organic EL device according to the preferred embodiment.

Referring to FIGS. 1 and 2, an organic EL element 1 is formed on a substrate 9 in the organic EL device according to a preferred embodiment. The organic EL element is divided into a plurality of regions (luminescent regions) T1~Tn (T1~T3 in FIG. 2), each luminescent region T is serially connected to one another. Each luminescent region T of the organic EL element is formed so as to have a rectangular shape having a side that is substantially parallel to a side of the substrate 9.

A transparent electrode 10 as a first electrode, an organic layer 20 for emitting light and an electrode 30 as a second electrode are layered in this order in each luminescent region T, so that a side of the transparent electrode 10 with respect to the organic layer 20 corresponds to a light emitting side from which the light is emitted to the outside of the organic EL device. Since the organic EL element 1 according to the preferred embodiment is a bottom emission type, the transparent electrode 10, the organic layer 20 and the electrode 30 are layered on the substrate 9 in this order.

As is apparent from FIGS. 1 and 2, an insulation portion 40 is arranged at least between the transparent electrodes 10 of the adjacent luminescent regions in the organic EL element 1. In the electrically adjacent luminescent regions T, the transparent electrode 10 of the luminescent region T is electrically connected to the electrode 30 of the other electrically adjacent luminescent region T. As described above, all of the luminescent regions are serially connected to one another.

Namely, the organic EL element 1 is divided into a plurality of luminescent regions T1 . . . Tn, and each luminescent region has the following structures.

The transparent electrode 10 is electrically connected to the electrode 30 of the other luminescent region T.

The insulation portion 40 is provided between the transparent electrodes 10 of the physically adjacent luminescent regions T.

The electrode 30 is connected to the transparent electrode 10 of the electrically connected luminescent region T (In one luminescent region, the electrode 30 is not connected to the transparent electrode 10).

In the luminescent region T provided at the electrical end of the organic EL element 1, the electrode that is not electrically connected to the electrode of the other luminescent region T is connected to an external drive circuit (not shown).

Hereinafter, each component will be described in detail. The insulation portion 40 is arranged at least between the transparent electrodes 10 of the physically adjacent luminescent regions T Due to the provision of the insulation portion 40 at its position, the insulation portion 40 performs the following functions.

Preventing the transparent electrodes 10 of the physically adjacent luminescent regions T from being connected to one another. If the transparent electrodes 10 of the luminescent regions are connected to one another, electric current does not flow in the organic EL element.

Preventing the transparent electrode 10 and the electrode 30 of the single luminescent region T from being short-circuited. The insulation portion 40 electrically covers the end of the transparent electrode 10, so as to prevent the luminescent region from not emitting light due to short-circuiting of the transparent electrode 10 and the electrode 30 of the luminescent region T.

To obtain the above functions more effectively, the insulation portion 40 is arranged so as to cover the end of the transparent electrode 10 on a side where the electrode 30 of the other luminescent region T is connected.

It is preferable that the insulation portion 40 has at least one of the following functions, that is, a function to transmit light with a wavelength emitted from the organic EL element 1 (transmission function), a function to reflect the above light (reflecting function) and a function to scatter the above light (scattering function). Hereinafter, each function will be described.

When the insulation portion 40 has the transmission function, the following actions and advantageous effects are obtained.

Figure 3A:
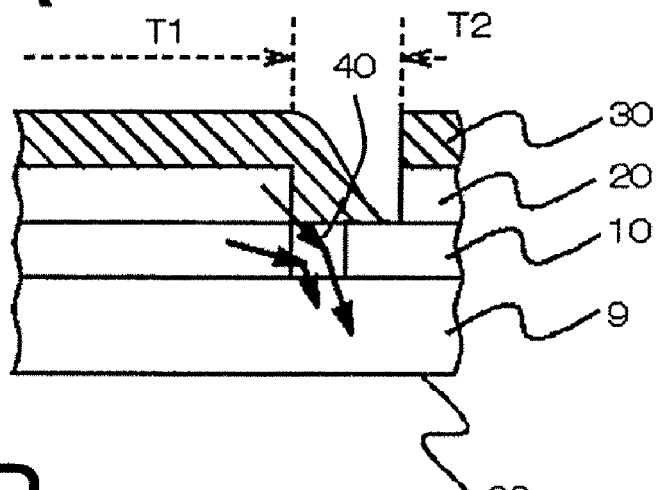
FIGS. 3A through 3C are cross-sectional views showing a first alternative example of an insulation portion in the organic EL device according to the preferred embodiment.

As shown in FIG. 3A, it is possible to make the light emitted from the end of the organic layer 20 and the light exiting from the end of the transparent electrode 10 come into the transparent substrate 9. Thus, an amount of the light exiting from the organic EL element 1 is increased.

Figure 3B:
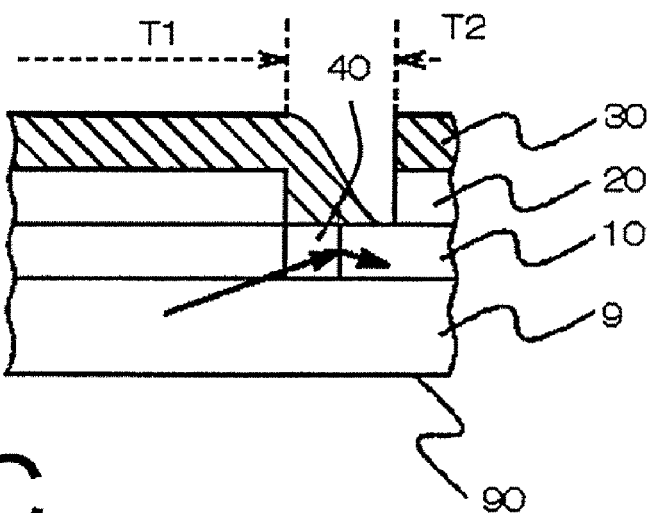

As shown in FIG. 3B, it is possible to transmit light coming into the insulation portion 40 through the transparent substrate 9.

Figure 3C:
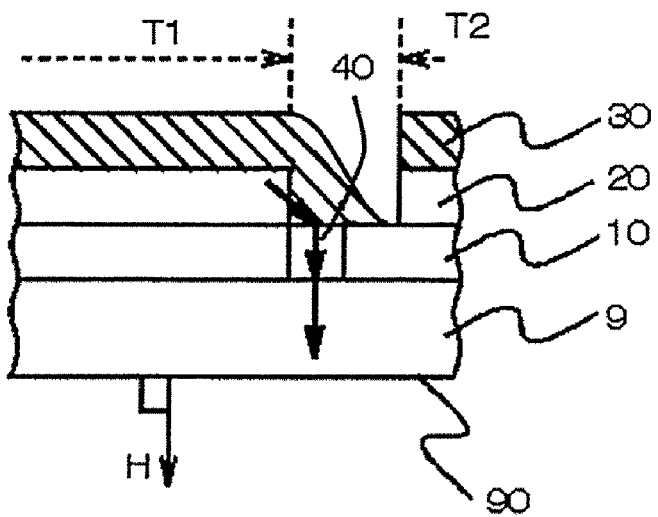

As shown in FIG. 3C, when a material is properly selected so that the insulation portion 40 has a refraction index different from adjacent components, it is possible that the light coming into the insulation portion 40 exits in a normal direction H of a light emitting plane 90 of the transparent substrate 9 from which the light is emitted. As described above, it is possible that the direction of the light coming into the insulation portion 40 is changed into a predetermined direction. Thus, light usability of the organic EL element 1 is improved.

In FIGS. 3A through 4B, arrows indicated by lines that are thicker than the other lines show the traveling directions of the light. To give the transmission function to the insulation portion 40, the insulation portion 40 is provided by a known method, using a material that has transparency with respect to the light incident upon the insulation portion 40. FIGS. 3A through 3C show a first alternative example of the insulation portion 40 in the organic EL device, and FIGS. 4A and 4B respectively show second and third alternative example of the insulation portion 40 in the organic EL device.

Figure 4A:
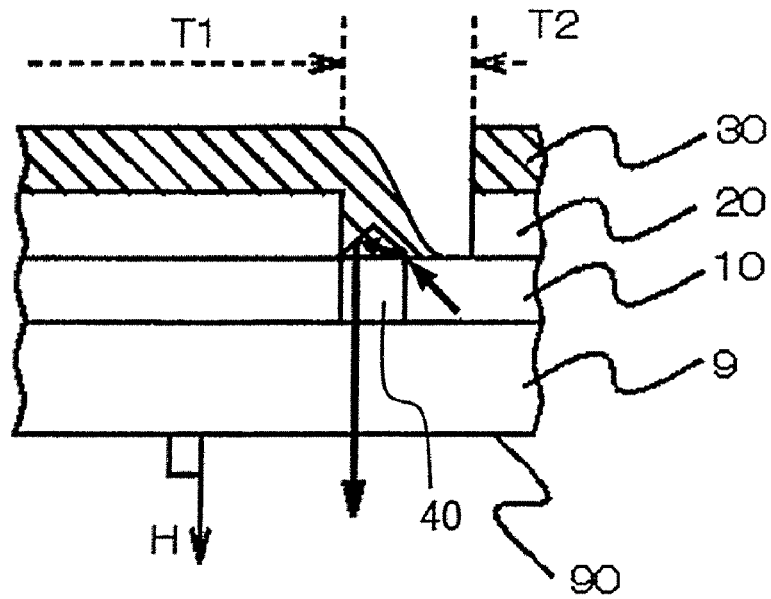
FIG. 4A is a cross-sectional view showing a second alternative example of the insulation portion in the organic EL device according to the preferred embodiment.

When the insulation portion 40 has the reflecting function, it is possible to emit (reflect) the light coming from the end of the transparent electrode 10 and the transparent substrate 9 into the insulation portion 40, toward the side of the transparent substrate 9. Let the plane direction of the organic layer 20 be standard, that is, let a plane substantially parallel to the organic layer 20 be standard plane. Preferably, the insulation portion 40 has a part (reflecting plate) for performing the reflecting function to reflect incoming light, so that the angle between the traveling direction of the incoming light and the standard plane is different from the angle between the traveling direction of the exiting light and the standard plane. For example, as shown in FIG. 4A, a reflecting part that is not parallel to the standard plane is provided in the insulation portion 40 on a side opposite to a side where the insulation portion 40 contacts the transparent substrate 9, so as to reflect the light at the reflecting part. Thus, the traveling direction of light with respect to the standard plane is changed due to the reflecting part, and for example, it is possible to make light travel in the normal direction H of the light emitting plane 90 of the transparent substrate 9. When an irregularity is provided in the standard plane, a hypothetical plane planarized at the height in the thickness direction of the transparent substrate 9 corresponds to the standard plane. Since the organic layer 20 is manufactured so as to have a substantially planar shape, generally, a plane substantially parallel to the organic layer 20 can be the standard plane.

A member for reflecting light is provided inside or outside of the above mentioned part, so that the reflecting function is achieved. As described later, if the reflecting function is given to the electrode 30 and the electrode 30 is provided so as to contact the insulation portion 40, the reflecting function is also achieved. Alternatively, it is possible that the refraction indices of the insulation portion 40 and its outside (the side opposite from the transparent substrate 9) are adjusted so that the light coming through the insulation portion 40 is totally reflected. In the specification, when the reflecting function is achieved by the combination of the insulation portion 40 and other member (e.g. the electrode 30) even though the insulation portion 40 itself does not have the reflecting function, it is described that the insulation portion 40 has the reflecting function.

Figure 4B:
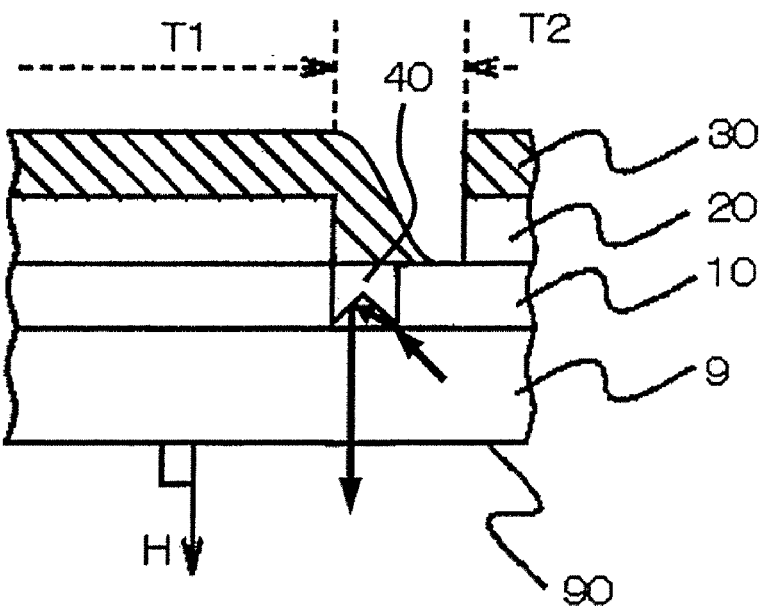
FIG. 4B is a cross-sectional view showing a third alternative example of the insulation portion in the organic EL device according to the preferred embodiment.

Meanwhile, the reflecting function may be achieved on the insulation portion 40 on a side of the transparent substrate 9. As shown in FIG. 4B, a reflecting member is provided in the insulation portion 40 on the side of the transparent substrate 9, so that the light coming from the side of the transparent substrate 9 totally reflected. Thus, it is possible to make the light traveling in the transparent substrate 9 in a direction opposite to the light emitting plane 90 travel in a direction to the light emitting plane 90. Also, as described above, it is preferable that the angle between the traveling direction of the incoming light and the standard plane is different from that between the reflected light and the standard plane, letting the standard plane be substantially parallel to the organic layer 20. Thus, an amount of the light exiting from the organic EL element 1 in a predetermined direction is increased similarly as described above.

As described above, when the reflecting function is achieved on the insulation portion 40 on the side of the transparent substrate 9, it is preferable that the light coming from the end of the organic layer 20 or the transparent electrode 10 into the insulation portion 40 is emitted toward the side of the transparent substrate 9. Namely, a function of half mirror that transmits a part of the light and reflects the rest of the light is given to the insulation portion 40. To have the function of the half mirror, by means of a known half mirror forming method, a known material for a half mirror is provided inside or outside of the insulation portion 40, or the half mirror is provided at a part where the transparent substrate 9 contacts the insulation portion 40. Thus, the reflecting function is achieved.

Alternatively, the refraction indices of the insulation portion 40 and the transparent substrate 9 may be respectively adjusted to appropriate values. Thus, it is possible that most of the light coming from the transparent substrate 9 into the insulation portion 40 is totally reflected at the interface between the insulation portion 40 and the transparent substrate 9, and that most of the light coming from the organic layer 20 into insulation portion 40 is emitted to the transparent substrate 9.

As described above, when the function of the half mirror is given to the insulation portion 40, the reflecting function is given to the insulation portion 40 on the side opposite to the transparent substrate 9, so as to prevent that the light exits from the side opposite from the transparent substrate 9 to the outside of the insulation portion 40.

If the scattering function is given to the insulation portion 40, it is possible to emit the light that cannot be emitted by the conventional structure. Namely, the traveling direction of the light coming into the insulation portion 40 with respect to the plane direction (the above standard plane) of the organic layer 20 is changed due to the scattering function, so that a part of the light is emitted to the outside of the organic EL element 1.

To give a scattering function to the insulation portion 40, a known method in which the scattering function is given to arbitrary elements is properly utilized, and for example, the following methods are utilized.

Figure 10A:
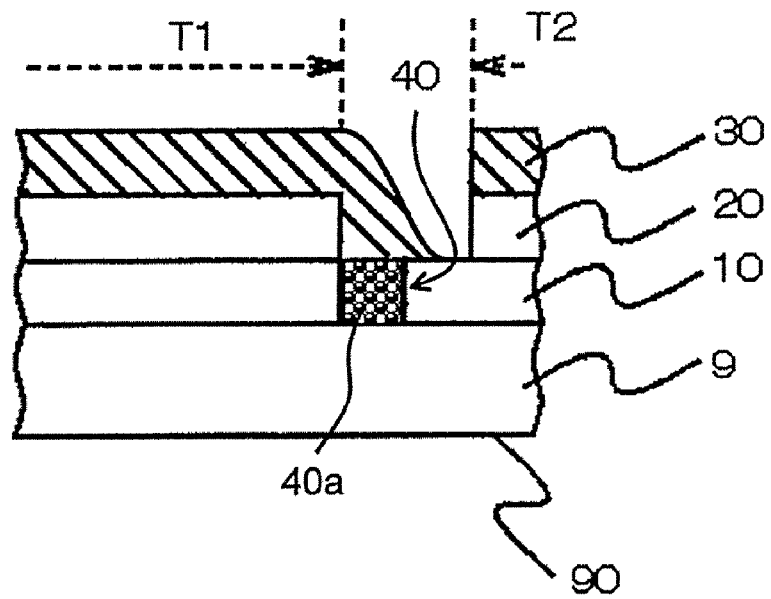
FIG. 10A is a cross-sectional view showing an example of the scattering function of the insulation portion in the organic EL device according to the preferred embodiment.

A large number of minute beads 40a having a refraction index that is different from that of the insulation portion 40 are dispersed in the insulation portion 40 as shown in FIG. 10A.

A large number of minute lens for scattering are formed on the surface of the insulation portion 40 by a fine processing method such as a resist method and a sand blasting method.

Figure 10B:
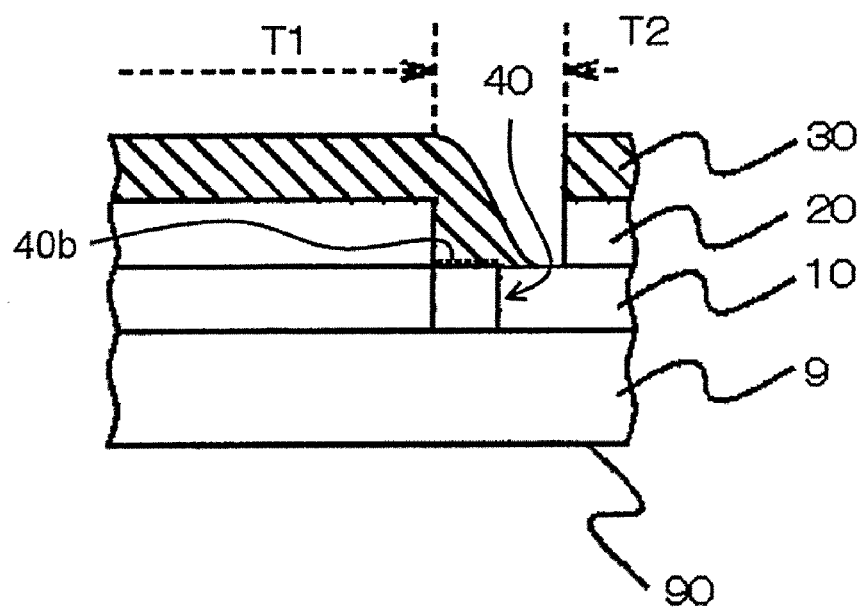
FIG. 10B is a cross-sectional view showing an example of the scattering function of the insulation portion in the organic EL device according to the preferred embodiment.

A large number of dots 40b for scattering are formed on the surface of the insulation portion 40 by a printing method as shown in FIG. 10B.

Next, the material and the shape of the insulation portion 40 will be described. If the insulation material insulates the physically adjacent transparent electrodes 10, a known insulation portion is properly utilized as the insulation portion 40. When the above functions are given to the insulation portion 40, the insulation portion 40 is properly modified in accordance with the above conditions.

Materials that fulfill the above conditions include transparent polymers, oxides and glass. More specifically, preferable transparent polymers include polyimide, fluoride polyimide, fluoride series resin, polykinon, polyoxajiazol, poly olefin with annular structure, polyalyrate, polycarbonate, polysalfine and ladder-type polysiloxane.

Preferable oxides include $SiO_2$, $Al_2O_3$, $Ta_2O_3$, $Si_3N_4$, fluorine-added $SiO_2$, $MgO$ and $YbO_3$ as preferable example of materials that can be processed by etching. Since such materials are easily processed by etching, the insulation portion 40 has an arbitrary (preferable) shape.

Furthermore, a photoresist having a photosensitivity and its hardened resultant are preferably utilized in addition to the above materials because the insulation portion 40 is processed by a photoresist method so as to have an arbitrary shape.

Since the organic layer 20 deteriorates due to water and oxygen, it is preferable to utilize materials whose water content is equal to or less than 0.1 percentage per weight and whose gas transmission coefficient (Japanese Industrial Standard K7126) is equal to or less than $1 \times 10^{-13}$ cc·cm/cm²·s·cmHg. Such materials include non-organic oxides, non-organic nitrides and the composition with non-organic oxides and non-organic nitrides.

The insulation portion 40 is formed on the transparent substrate 9 by a known thin-film formation method, such as a vapor deposition method or a chemical vapor deposition method, using these materials.

Any shape of the insulation portion 40 is acceptable when the insulation portion 40 electrically insulates each transparent electrode 10 of the physically adjacent luminescent regions T. Also, as described above, it is preferable that the insulation portion 40 has a shape that covers the end of the transparent electrode 10 on the side where the electrode 30 of the other luminescent region T is connected. Thus, it is preferable that the thickness of the insulation portion 40 is substantially the same as that of the transparent electrode 10.

Furthermore, as shown in FIG. 1, when a substantially rectangular substrate 9 is utilized, the insulation portion 40 has substantially a rectangular shape that has a side parallel to the side of the transparent substrate 9. When the insulation portion 40 is provided as described above, the luminescent regions T are physically and serially arranged as shown in FIG. 1. Thus, the luminescent regions T are easily and electrically connected to one another. Namely, since the physically adjacent luminescent regions T are also electrically connected to one another, the distance between the electrically adjacent luminescent regions T is minimized.

It is preferable that the width of the insulation portion 40, that is, the distance between the adjacent luminescent regions T is small enough to be invisible to the naked eye, and is generally equal to or less than 300 µm. Also, when a scattering plate is utilized and the above scattering function and the above reflecting function are given to the insulation portion 40, the width of the insulation portion 40 is equal to or less than 500 µm.

Next, the components of the organic EL element 1 and the organic EL device except for the insulation portion 40 will be described. In each luminescent region T, the transparent electrode 10, the organic layer 20 and the electrode 30 are layered in this order, and each luminescent region T is serially connected to one another as described above. Thus, the same amount of the electric current flows in each luminescent region T.

The organic layer 20 of each luminescent region T has substantially the same layer structure, and preferably the same layer structure. Furthermore, the material that is contained in each layer of the organic layer 20 is substantially the same as that in like layers in the other luminescent regions T, and preferably the same. The thickness of each layer is substantially the same as those of the like layers in the other luminescent regions T, and preferably the same. Due to utilizing such structure, when the same amount of electric current flows in each luminescent region T, light having the same luminance is emitted (e.g. refer to Non-patent reference, P46-47 and FIG. 9, "Organic EL Element and Forefront of its Industrialization" edited by Seizo Miyata of NTS corporation, published on Nov. 30, 1998).

In the above description, the like layer means a layer having the same function. For example, when each luminescent region has a structure wherein a hole transport layer, a luminescent layer, an electron transport layer are layered in order, the hole transport layers, the luminescent layers and the electron transport layers are respectively compared with one another. Containing substantially the same material means containing material whose skeleton is at least the same, preferably material having one or a few different substituent, and desirably the same material. Also, it is preferable that content of the material is the same, and the way of containing the material or a film formation method is the same. Furthermore, when the above-described organic layer is constructed, it is preferable that light emitted from each luminescent region is substantially the same. The substantially same organic luminescent materials include organic luminescent materials having substantially the same luminescent peak wavelengths, substantially the same peak patterns and substantially the same amount of light relative to electric current. Similarly, substantially the same materials include materials having equivalent carrier transport performances, equivalent carrier injection performances, equivalent ionization potentials or equivalent electron affinities.

When the organic layer 20 contains a plurality of organic luminescent materials whose luminescent colors (luminescent peak) are respectively different from that of at least one of the other organic luminescent materials so as to emit light with a plurality of wavelengths, the strength of each wavelength of the light emitted from each luminescent region T is substantially the same due to utilizing the above structure. It occurs because the same magnitude of electric current flows in each luminescent region T. Thus, the luminescent color expressed as color mixture of lights of wavelengths becomes the same in each luminescent region T.

Hereinafter, each of the layers constituting the luminescent region T will be described. The organic layer 20 is arranged between the transparent electrode 10 and the electrode 30. The organic layer 20 contains an organic luminescent material that emits light when a voltage is applied between the electrodes 10 and 30. The organic layer 20 corresponds to a known layer having a known layer structure and a known material in a known organic EL element. Also, the organic layer 20 is manufactured by means of a known manufacturing method.

Namely, the organic layer 20 performs at least one of the following functions and has a laminated structure. Each layer may have either function, or a single layer may have the following functions.

Electron injection function wherein electrons are injected from an electrode (cathode), that is, electron injection characteristics Hole injection function wherein holes are injected from an electrode (anode), that is, hole injection characteristics Carrier transport function that transports at least one of electrons and holes, that is, carrier transport characteristics. A function that transports electrons is described as an electron transport function (electron transport characteristics), and a function that transports holes is described as a hole transport function (hole transport characteristics).

Emission function that recombines injected and transported electrons and holes to generate exciton (turn into an excited state) and emits light upon returning to a ground state.

When the transparent electrode 10 is an anode, the organic layer 20 may be formed so that a hole injection transport layer, a luminescent layer, and an electron injection transport layer are layered in this order from the transparent electrode 10.

The hole injection transport layer is a layer that transports hole from the anode to the luminescent layer. A material for forming the hole injection transport layer is selected from small molecular materials such as metal phthalocyanine including copper phthalocyanine and tetra (t-butyl) copper phthalocyanine, non-metal phthalocyanine, quinacridone compounds, 1,1-bis(4-di-p-tolylaminophenyl) cyclohexane, and aromatic amines including N,N'-diphenyl-N,N'-bis(3-methiylphenyl)-1,1'-biphenyl-4,4'-diamine and N,N'-di-(1-naphthyl)-N,N'-diphenyl-1,1'-biphenyl-4,4'-diamine; polymer materials such as polythiophene and polyaniline; polythiophene oligomer materials; and the other existing materials for transporting hole.

The luminescent layer is a layer that recombines the holes transported from the side of the anode and the electrons transported from the side of the cathode to turn into the excited state and emits light upon returning from the excited state to the ground state. Fluorescent materials and phosphorescent materials are utilized for materials of the luminescent layer. Alternatively, a host material contains a dopant (fluorescent material and phosphorescent material).

The material for forming the luminescent layer is selected from small molecular materials such as 9,10-diallyl-anthracene derivative, pyrene derivative, coronene derivative, perylene derivative, 1,1,4,4-tetraphenylbutadiene, tris(8-quinolinolate)aluminum complex, tris(4-methly-8-quinolinolate)aluminum complex, bis(8-quinolinolate) zinc complex, tris(4-methyl-5-triofluolomethyl-8-quinolinolate) aluminum complex, tris(4-methyl-5-cyano-8-quinolinolate)

aluminum complex, bis(2-methyl-5-trifluolomethyl-8-quinolinolate) [4-(4-cyanophenyl) phenolato]aluminum complex, bis(2-methyl-5-cyano-8-quinolinolate)[4-(4-cyanophenyl)phenolato]aluminum complex, tris(8-quinolinolate)scandium complex, bis[8-(para-tosyl)aminoquinoline] zinc complex, bis[8-(para-tosyl)aminoquinoline]cadmium complex, 1,2,3,4-tetraphenylcyclopentadiene, pentapheylcyclopentadiene, poly-2,5-dihepthyloxy-para-phenylenvinylene, coumarin series fluorescent substances, perylene series fluorescent substances, pyran series fluorescent substances, anthrone series fluorescent substances, porphyrin series fluorescent substances, quinacridone series fluorescent substances, N,N'-dialkyl-substituted quinacridone series fluorescent substances, naphtalimido series fluorescent substances and N,N'-diallyl-substituted pyrrolopyrrole series fluorescent substances; polymer materials such as polyfluorene, polypara-phenylenevinylene and polythiophene; and other existing luminescent materials. When a host-guest type structure is utilized, a host and a guest (dopant) are properly selected from these materials.

The electron injection transport layer is a layer that transports electrons from the cathode (the electrode 30 in the preferred embodiment) to the luminescent layer. Materials for forming the electron injection transport layer include 2-(4-biphenylyl)-5-(4-t-butylphenyl)-1,3,4-oxadiazole, 2,5-bis(1-naphthyl)-1,3,4-oxadiazole, oxadiazole derivative, bis(10-hydroxybenzo[h]quinolinolate) beryllium complex and triazole compounds.

In the organic layer 20, it is possible to provide known layers, such as a buffer layer, a hole blocking layer, an electron injection layer and a hole injection layer, which are utilized in a known organic electroluminescent layer. These layers are formed by means of a known manufacturing method, using known material. For example, an electron injection transport layer may be divided into an electron injection layer for performing the electron injection function and an electron transport layer for performing the electron transport function and may be layered. The material for forming each layer is properly selected from known materials in accordance with the function of each layer or is selected from the above materials for forming the electron injection transport layer.

Next, the transparent electrode 10 together with the electrode 30 will be described. One of a pair of electrodes functions as an anode, and the other electrode functions as a cathode. The anode of each luminescent region T is connected to the cathode of the electrically adjacent (preferably physically adjacent) luminescent region T, and the cathode of each luminescent region T is connected to the anode of another electrically adjacent luminescent region T.

The anode is an electrode that injects holes to the organic layer 20. The material for forming the anode provides the above characteristics to the anode and is generally selected from known materials such as metals, alloys, electrically conductive chemical compounds, and mixtures of these materials. The anode is manufactured so that the work function of a surface that contacts the anode is equal to or more than 4 eV.

The material for forming the anode is selected from the following materials: metal oxides such as ITO (indium-tin-oxide), IZO (indium-zinc-oxide), tin oxide, zinc oxide and zinc-aluminum oxide; metal nitrides such as titan nitride; metals such as gold, platinum, silver, copper, aluminum, nickel, cobalt, zinc, chrome, molybdenum, tungsten, tantalum and columbium; alloys of these metals; alloys of copper iodide; and electrically conductive polymers such as polyaniline, polythiophene, polypyrrole, poly (3-methylthiophene) and polyphenylenesulfide.

When the transparent electrode 10 is the anode, transmittivity with respect to the output light is generally set to be larger than 10 percent. When light of a visible light range is emitted, an ITO whose transmittivity is high in the visible light range is preferably utilized.

When the electrode 30 is the anode, the electrode 30 is preferably formed as a reflective electrode. In this case, the material, which functions to reflect the light that is emitted to the outside, is properly selected from the above materials, and generally from metals, alloys and metallic compounds.

The anode may be formed by using only one of the above materials or mixing more than one of the above materials. Also, the anode may have a multilayered structure including a plurality of layers constituted of the same composition or a different composition.

The thickness of the anode ranges generally from 5 nm to 1 μm, preferably from 10 nm to 1 μm, more preferably from 10 nm to 500 nm, much more preferably from 10 nm to 300 nm, desirably from 10 nm to 200 nm.

The anode is formed by means of a known thin-film formation method such as a sputtering method, an ion-plating method, a vacuum vapor deposition method, a spin coat method and an electric beam vapor deposition method, using the above materials. The sheet electric resistance of the anode is preferably equal to or less than several hundreds Ω/□, more preferably ranges from 5 to 50 Ω/□.

The surface of the anode may be washed by means of UV ozone washing or plasma washing. To prevent the short-circuits and defects in the organic EL element, a root-mean-square value of roughness of the surface is controlled to be equal to or less than 20 nm by means of a method to make minute diameters smaller or a method to polish after forming a film.

The cathode is an electrode that injects electrons to the organic layer 20 (the electron injection transport layer in the above layer structure). As material for forming the cathode, metals, alloys, electrically conductive chemical compounds or mixtures of these materials are utilized, and each has a work function that is less than 4.5 eV for increasing efficiency of electron injection, generally equal to or less than 4.0 eV, and typically equal to or less than 3.7 eV.

The above materials for the cathode include lithium, sodium, magnesium, gold, silver, copper, aluminum, indium, calcium, tin, ruthenium, titanium, manganese, chrome, yttrium, aluminum-calcium alloy, aluminum-lithium alloy, aluminum-magnesium alloy, magnesium-silver alloy, magnesium-indium alloy, lithium indium alloy, sodium-potassium alloy, a mixture of magnesium and copper and a mixture of aluminum and aluminum oxide. The material utilized for the anode may be also utilized for the cathode.

When the electrode 30 is the cathode, the material, which functions to reflect the light that is emitted to the outside, is preferably selected from the above materials, and metals, alloys and metallic compounds are generally selected.

When the transparent electrode 10 is the cathode, the transmittivity with respect to the output light is set to be 10 percent. For example, an electrode formed so that an electrically conductive transparent oxide is layered on a microfilm-like magnesium-silver alloy is utilized. Also, in order to prevent the luminescent layer from being damaged by plasma when the electrically conductive oxide is processed by sputtering, a buffer layer to which copper phthalocyanine is added is provided between the cathode and the organic layer 20.

The cathode may be formed by using only one of the above materials or more than one of the above materials. For example, when 5 percent to 10 percent of silver or copper is added to magnesium, oxidation of the cathode is prevented, and adhesion of the cathode with the organic layer 20 is enhanced.

The cathode may have a multilayered structure including a plurality of layers constituted of the same composition or different compositions. For example, the cathode may have the following structure.

A protection layer made of a metal with corrosion resistance is provided on a part of the cathode that does not contact the organic layer 20 in order to prevent the oxidation of the cathode. Silver and aluminum are preferably utilized as material for forming the protection layer.

An oxide, a fluoride or a metallic compound, whose work functions are small, is inserted in the interface between the cathode and the organic layer 20. For example, the material for the cathode is aluminum, and lithium fluoride or lithium oxide is inserted in the interface.

The cathode is formed by means of a known method such as the vacuum vapor deposition method, the sputtering method, an ionized vapor deposition method, the ion plating method or an electric beam deposition method. The sheet electrical resistance of the cathode is preferably set to be equal to or less than several hundreds $\Omega/\square$.

Next, layers and components that are preferably utilized in the organic EL element 1 will be described. In order not to short-circuit the transparent electrode 10 and the electrode 30, an insulation layer is provided at the outer periphery of the organic layer 20. The provision of the insulation layer also prevents the transparent electrode 10 and the electrode 30 of the electrically adjacent luminescent region T from contacting the organic layer 20. The material for forming the insulation portion, which is utilized in a known organic EL element, is properly utilized as material for forming the insulation layer. For example, the above materials for forming the insulation portion 40 are utilized. A known formation method is utilized as a formation method, for example, a sputtering method, an electron vapor deposition method and a chemical vapor deposition method are utilized.

Figure 5:
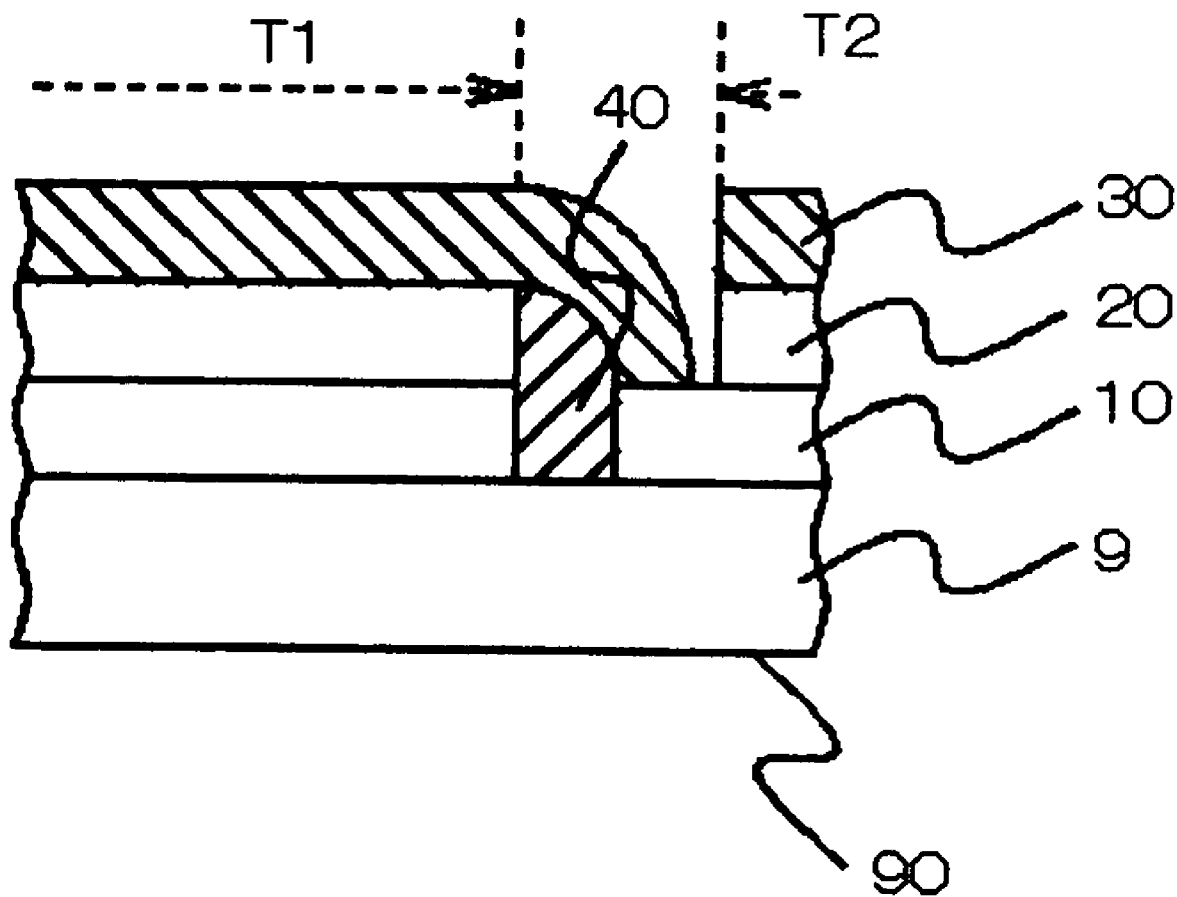
FIG. 5 is a cross-sectional view showing a fourth alternative example of the insulation portion in the organic EL device according to the preferred embodiment.

Alternatively, the insulation portion 40 serves as a part of the insulation layer. Namely, as shown in FIG. 5, the insulation portion 40 is provided so as to contact the end of the transparent electrode 10 and a part of the end (e.g. a side) of the organic layer 20. FIG. 5 shows a fourth alternative example of the insulation portion 40 in the organic EL device.

As described above, it is preferable to prevent the transparent electrode 10 and the electrode 30 of the electrically adjacent luminescent region T from contacting the organic layer 20. If the transparent electrode 10 and the electrode 30 of the electrically adjacent luminescent region T contact the organic layer 20, electric current almost flows from the contact position to the paired electrode (the cathode if the anode contacts the organic layer 20, the anode if the cathode contacts the organic layer 20). Thus, there is a great possibility that the luminescent region T does not emit light from its entire area.

It is possible to provide an auxiliary electrode. The auxiliary electrode is electrically connected to the anode or the cathode and is made of a material whose volume resistivity is smaller than that of the electrode connected to the auxiliary electrode. When the auxiliary electrode is made of such a material, it is possible to reduce the volume resistivity of the total electrode to which the auxiliary electrode is provided, thereby reducing the maximum difference between the amount of the electric current flowing in each spot of the organic layer 20 in comparison to the case where an auxiliary electrode is not provided.

Materials for forming the auxiliary electrode include tungsten (W), aluminum (Al), silver (Ag), molybdenum (Mo), tantalum (Ta), gold (Au), Chrome (Cr), titan (Ti), neodymium (Nd) and alloys of these metals. Examples of these alloys include Mo—W, Ta—W, Al—Ta, Al—Ti, Al—Nd and Al—Zr. Furthermore, the material for the component of an auxiliary wiring layer is preferably selected from compounds of metal and silicon, such as $TiSi_2$, $ZrSi_2$, $HfSi_2$, $VSi_2$, $NbSi_2$, $TaSi_2$, $CrSi_2$, $Wsi_2$, $CoSi_2$, $NiSi_2$, $PtSi$ and $Pd_2Si$. Alternatively, the auxiliary wiring layer may have a structure wherein the compounds of metal and silicon are layered.

Although the auxiliary electrode may be a single-layered film made of the above materials, the auxiliary electrode is preferably a multilayered film having two layers or more in order to enhance the stability of the film. The multilayered film is formed using the above metals or the alloys thereof. For example, in the case of three layers, the combination of the layers includes the combination of a Ta layer, a Cu layer and a Ta layer, and the combination of a Ta layer, an Al layer and a Ta layer. In the case of two layers, the combination of the layers includes the combination of an Al layer and a Ta layer, and the combination of a Cr layer and an Au layer, the combination of a Cr layer and an Al layer, and the combination of an Al layer and a Mo layer. Meanwhile, the stability of the film means that the film is hard to corrode by the liquid utilized during etching while maintaining its volume resistivity. When the auxiliary electrode is made of Cu and Ag, the auxiliary electrode is likely to corrode, although the volume resistivity of the auxiliary electrode is small. However, a film made of corrosion resistant metal such as Ta, Cr and Mo is layered on either the upper portion or the lower portion of a metallic film of Cu and Ag or both, thus enhancing the stability of the auxiliary electrode.

The thickness of the auxiliary electrode ranges generally from 100 nm to several tens μm, preferably from 200 nm to 5 μm. If the thickness of the auxiliary electrode is less than 100 nm, the electric resistance is large, so that the thickness is inappropriate for the auxiliary electrode. On the other hand, if the thickness of the auxiliary electrode is more than 10 μm, it is hard to planarize the auxiliary electrode, so that there is a fear that defects in the organic EL element 1 will occur.

The width of the auxiliary electrode ranges preferably from 2 μm to 1000 μm, more preferably from 5 μm to 300 μm. If the width of the auxiliary electrode is less than 2 μm, the electric resistance of the auxiliary electrode is likely to increase. On the other hand, if the width of the auxiliary electrode is more than 100 μm, the auxiliary electrode will be likely to prevent the light from being emitted to the outside.

The organic EL element 1 may be protected by a passivation film and a sealing can in order to protect the organic layer 20 from the outside air.

A passivation film is a protection layer (sealing layer) provided on a side opposite to the transparent substrate 9 in order to prevent the organic EL element 1 from contacting oxygen and water. Materials utilized for the passivation film includes polymeric organic materials, non-organic materials, and furthermore photocuring resin. One of the above materials or more than one of the above materials may be utilized as the material for the protection layer. The protection layer may have a single-layered structure or a multilayered structure. The passivation film has a thickness sufficient to block water and gas from the outside.

Examples of the polymeric organic materials include fluorine series resins such as chlorotrifluoroethylene polymers, dichlorodifluoroethylene polymers and copolymers of chlorotrifluoroethylene polymers and dichlorodifluoroethylene polymers, acryl series resins such as polymethyl methacrylate and polyacrylate, epoxy resin, silicon resin, epoxy silicon resin, polystyrene resin, polyester resin, polycarbonate resin, polyamide resin, polyimide resin, polyamide-imide resin, polyparaxylene resin, polyethylene resin and polyphenylene oxide resin.

The non-organic materials include polysilazane, diamond thin-film, amorphous silica, electrically insulative glass, metal oxide, metal nitride, metal carbide and metal sulfide.

A sealing can is a member constituted of a sealing member, such as a sealing plate and a sealing container, for blocking water and oxygen from the outside. The sealing can may be provided on a back face side and on a side of the electrode (on the side opposite to the transparent substrate 9) or may cover the whole organic EL element 1. As long as the sealing member can seal the organic EL element 1 to block water and gas from the outside, the thickness, the shape and the size of the sealing member are not limited. Glass, stainless steel, metals (aluminum etc.), plastics (polychlorotrifluoethylene, polyester, polycarbonate etc.) and ceramics are utilized as material for the sealing member.

When the sealing member is provided on the organic EL element 1, a sealant (adhesive) may be properly utilized. When the whole organic EL element is covered with the sealing member, the sealing member may be fused by heat without utilizing the sealant. Ultraviolet curing resins, heat curing resins and two-part curing resins may be utilized as the sealant.

A water absorber may be inserted into a space between the passivation film or the sealing can and the organic EL element 1. The water absorber is not particularly limited, and examples of the water absorber include barium oxide, sodium oxide, potassium oxide, calcium oxide, sodium sulfide, calcium sulfide, magnesium sulfide, phosphorus pentaoxide, calcium chloride, magnesium chloride, copper chloride, cesium fluoride, columbium fluoride, calcium bromide, vanadium bromide, molecular sieve, zeolite and magnesium oxide.

An inactive gas may be filled in the passivation film and the sealing can. The inactive gas is a gas that does not react with the organic EL element 1, and rare gases such as helium and argon is utilized.

Next, the substrate 9 will be described. The substrate 9 is a plate-like member for supporting the organic EL element 1. Since the organic EL element 1 is extremely thin, the organic EL element 1 is supported by the substrate 9 to be manufactured as part of the organic EL device.

Since the substrate 9 is a member on which the organic EL element 1 is layered, it is preferable that the substrate 9 has planar smoothness. When the substrate 9 is located on the light emitting side with respect to the organic layer 20, the substrate 9 must be transparent to the emitted light. Since the organic EL element 1 is a bottom emission type element, the substrate 9 is transparent, and a plane 90 of the substrate 9, which is located on a side opposite to the plane of the substrate 9 that contacts the organic EL element 1, corresponds to the light emitting plane.

If the substrate has the above function, a known substrate is utilized as the substrate 9. A ceramics substrate such as a glass substrate, a silicon substrate and a quartz substrate, and a plastic substrate are generally selected. Also, a metallic substrate and a substrate in which a metallic foil is formed around a base material are utilized. Furthermore, it is possible to utilize a substrate constituted of a composite sheet that is formed by combining a plurality of substrates that are the same kind or different kinds.

The above preferred embodiment shows the bottom emission type organic EL device in which the transparent electrode 10, the organic layer 20 and the electrode 30 are layered on the substrate 9 in this order. However, an organic EL element 1 that does not include the substrate 9 may be formed. In this case, the organic EL element 1 is manufactured without using the substrate 9 from an initial stage, or the organic EL element 1 may be manufactured by removing the substrate 9 by means of a known substrate-removing technique such as etching after manufacturing the organic EL device. Also, as described above, the organic EL device may be constructed as a top emission type or the device in which the light exits from both sides of the device.

Next, the manufacturing method of the organic EL element 1 will be described. The following description shows an example (an example of manufacturing the organic EL device) of manufacturing the organic EL element 1 on the substrate 9.

The organic EL device is manufactured by properly layering each layer constituting the organic EL element on the substrate 9, using the above thin-film formation method and the above materials. However, the organic EL device may be manufactured as follows.

Figure 6A:
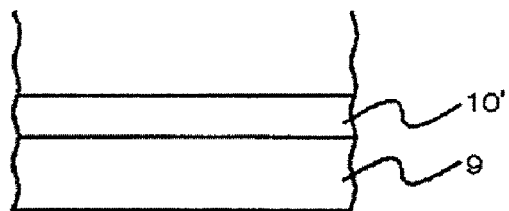
FIGS. 6A through 6E are views showing an example of a process for manufacturing the organic EL device according to the preferred embodiment.
Figure 6D:
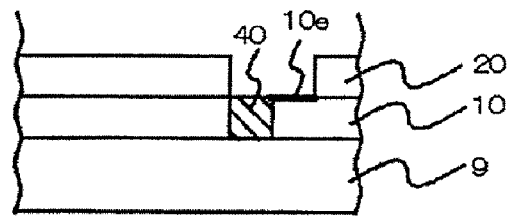
Figure 6B:
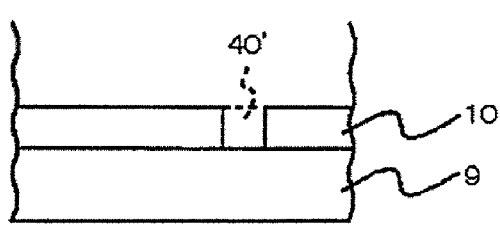
Figure 6E:
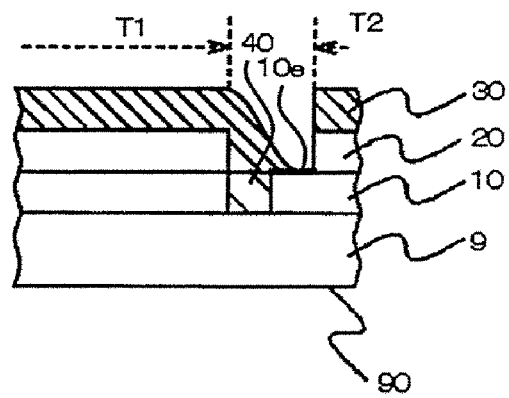
Figure 6B:
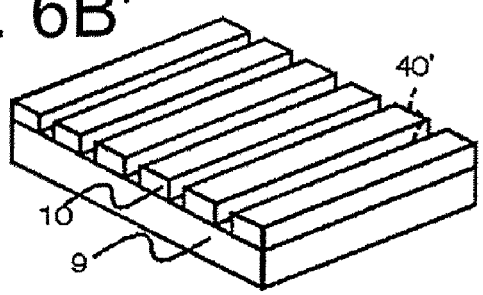
Figure 6C:
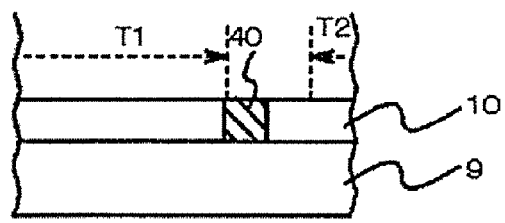

For example, the organic EL device is manufactured as shown in FIGS. 6A through 6E. As shown in FIG. 6A, a layer 10' of the material for forming the transparent electrode 10 is formed on the plate-like substrate 9 whose surface shape is substantially rectangular, by means of the above deposition method of the transparent electrode. Then, as shown in FIG. 6B, a portion 40' is removed from the layer 10' for providing the insulation portion 40. As shown in FIG. 6B', the portion 40' is substantially a rectangular area having a side parallel to a side of the substrate 9. A known method may be properly utilized as a removing method, for example, a part of the layer 10' is removed mechanically by grinding or etching. Alternatively, a mask is provided on the part of the layer 10' where the insulation portion 40 is not provided before removing the portion 40', and the mask is removed after removing the portion 40'. Then, as shown in FIG. 6C, the above material for the insulation portion 40 is placed in the space 40' by means of the above formation method for the insulation portion 40 to form the insulation portion 40, thereby insulating each luminescent region T from one another.

As shown in FIG. 6D, the organic layer 20 is formed on the transparent electrode 10 after forming the insulation portion 40. The organic EL layer 20 is not provided on the whole transparent electrode 10. The organic EL layer 20 is provided so as to expose the surface of the transparent electrode 10 (the surface on the side opposite to the substrate 9) on at least one of sides parallel to the side of the substrate 9. Hereinafter, the exposed portion of the transparent electrode 10 is referred to as reference numeral 10e. To provide the exposed portion 10e of the transparent electrode 10 as described above, it is necessary to divide the transparent electrode 10 into two parts, one of the parts on which the organic EL layer 20 is provided, the other on which the organic EL layer 20 is not provided. Therefore, a known film formation method for forming the organic layer in a minute region is utilized. For example, the organic layer 20 is layered after masking the part on which the organic layer 20 is not provided, and then the mask is removed. Alternatively, selecting a material that can be layered by a printing method, the organic layer 20 is formed by means of a known fine printing technique.

As shown in FIG. 6E, after forming the organic layer 20, the electrode 30 is provided to extend from the organic layer 20 to the exposed portion 10e of the transparent electrode 10 of the other luminescent region T over the insulation portion 40. On the organic layer 20, the electrode 30 is provided so as to closely contact the organic layer 20. The electrode 30 is provided so as to be electrically connected to the transparent electrode 10 of the adjacent luminescent region T between the end of the organic layer 20 and the exposed portion 10e of the adjacent luminescent region T. Namely, the electrode 30 is electrically connected to at least a part of the exposed portion 10e of the transparent electrode 10 of the adjacent luminescent region T. Thus, each luminescent region T is electrically and serially connected to one another.

Alternatively, a part of the electrode 30 on the organic layer 20 may be connected to a part of the exposed portion 10e of the transparent electrode 10 of the adjacent luminescent region T by another member, not by the electrode 30.

It is preferable that a known protection layer is provided on the above-manufactured organic EL element (the organic EL device) as described above.

Figure 7A:
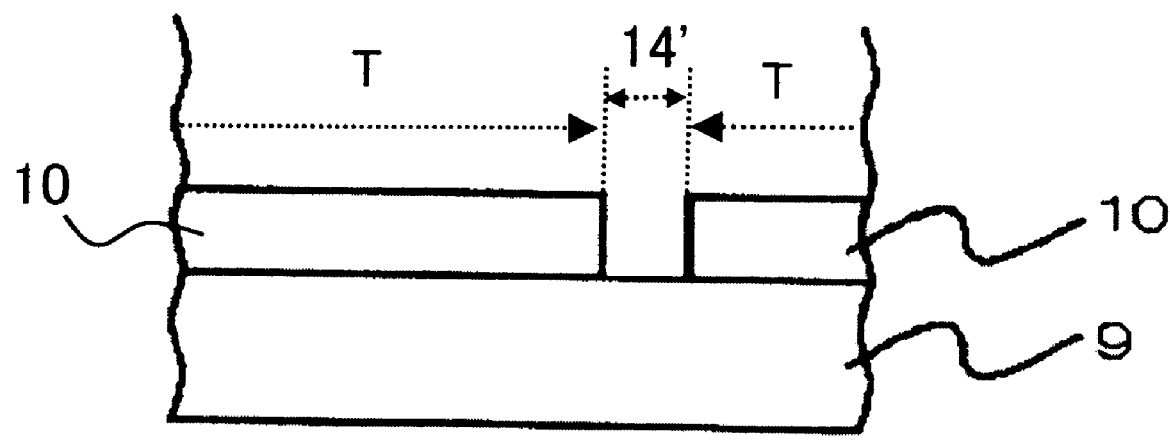
FIGS. 7A and 7B are views showing a first alternative example of a process for manufacturing the organic EL device according to the preferred embodiment.
Figure 7B:
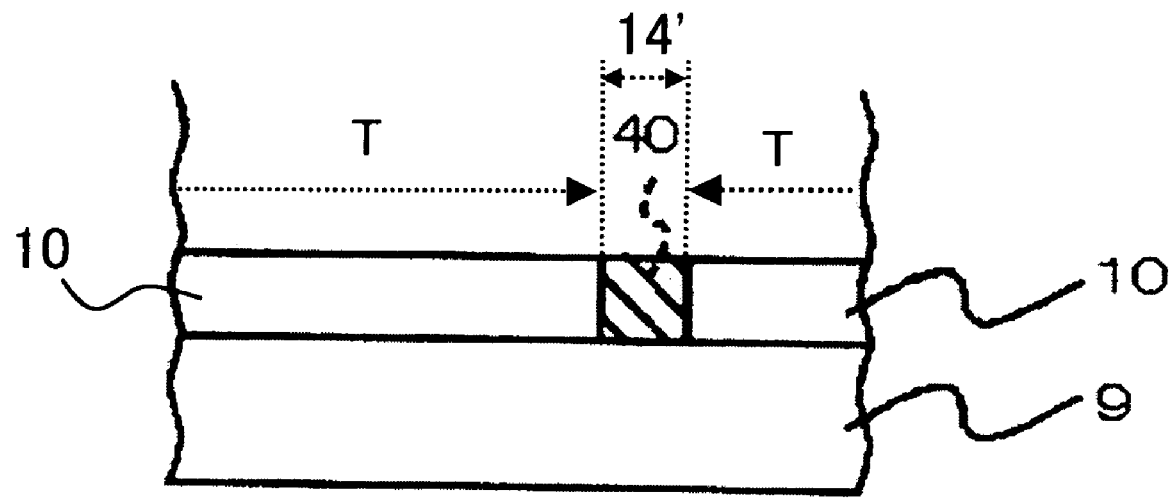
Figure 8A:
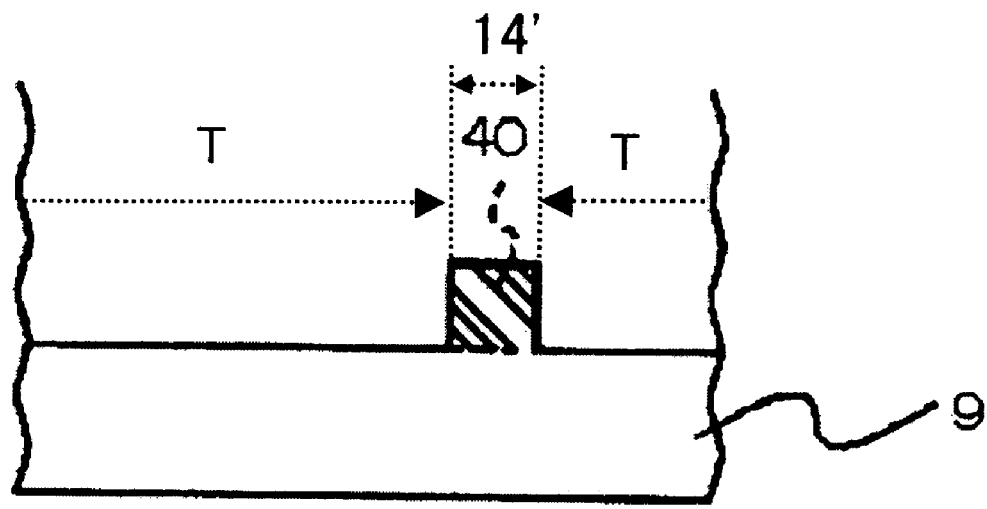
FIGS. 8A and 8B are views showing a second alternative example of a process for manufacturing the organic EL device according to the preferred embodiment.
Figure 8B:
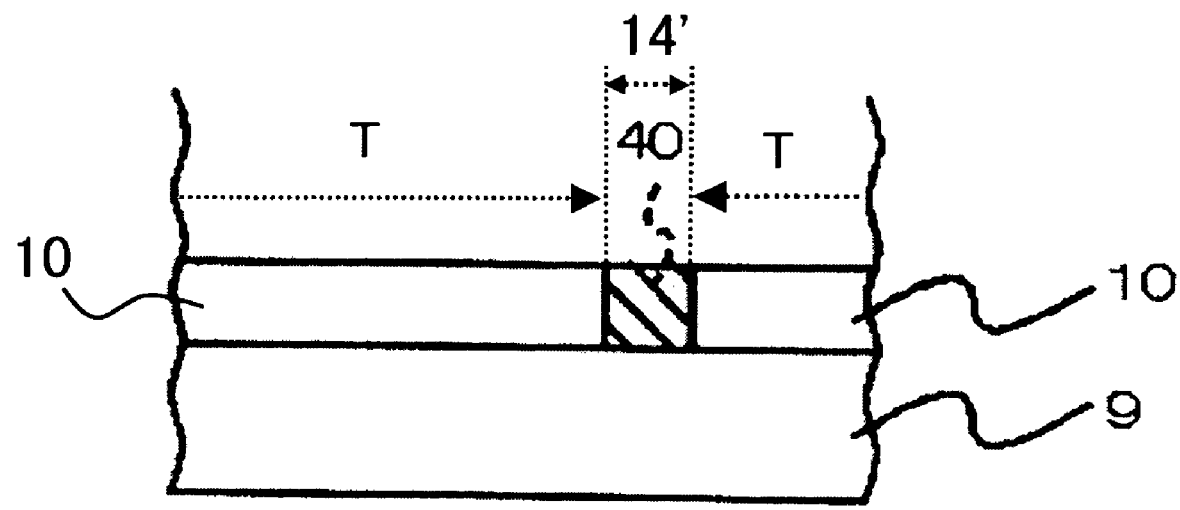

Instead of processes (the processes shown in FIGS. 6A through 6C) until the insulation portion 40 is formed, the transparent electrodes 10 are layered on only the luminescent regions T in advance, and the insulation portion 40 may be layered on a region 14' that is on the substrate 9 as a first alternative example as shown in FIGS. 7A and 7B. On the other hand, the insulation portion 40 is layered on the region 14' in advance, and then the transparent electrode 10 may be layered on the luminescent region T as a second example, as shown in FIGS. 8A and 8B. Furthermore, instead of the processes shown in FIGS. 6A through 6C, processes shown in FIGS. 9A through 9C may be conducted to form the transparent portion 10 and the insulation portion 40 on predetermined positions that are on the substrate 9, respectively. The following will describe a third alternative example of the manufacturing method in which the processes shown in FIGS. 6A through 6C are replaced by the processes shown in FIGS. 9A through 9C.

Figure 9A:
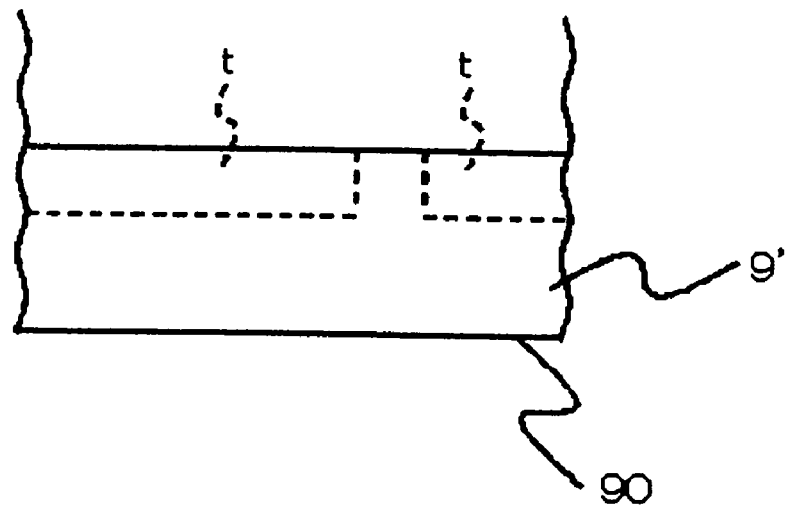
FIGS. 9A through 9C are views showing an a third example of a process for manufacturing the organic EL device according to the preferred embodiment.
Figure 9B:
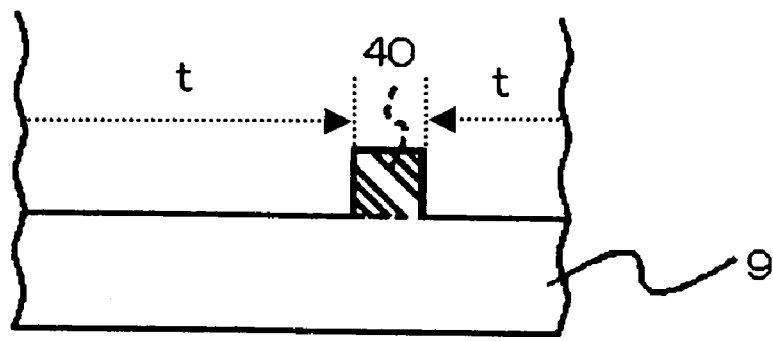
Figure 9C:
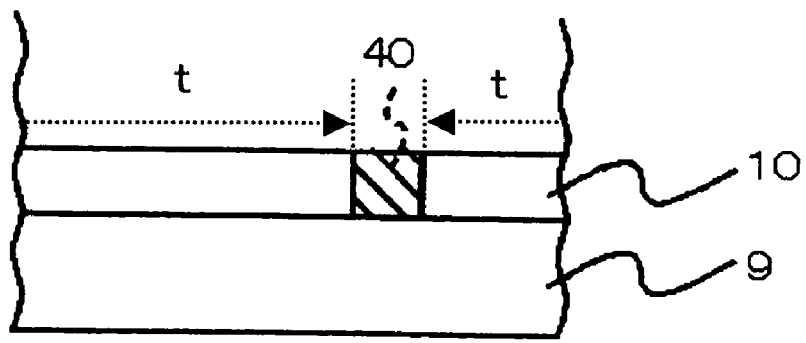

In the manufacture, as shown in FIG. 9A, a plate-like substrate 9' having insulation characteristics and substantially a rectangular surface is prepared. Portions (hereinafter referred to as regions t) where the transparent electrodes 10 provided on the substrate 9' are removed from the substrate 9' so that the remaining portion of the substrate 9' corresponding to the region t is thinner than the other portion of the substrate 9'. Thus, the substrate 9' is shaped as shown in FIG. 9B to form the substrate 9. Namely, the other portion or a protrusion becomes the insulation portion 40. In other words, a part of the substrate 9' corresponding to the region t for the luminescent region is thinner than that corresponding to the region for the insulation portion 40, thereby forming the insulation portion 40. Then, as shown in FIG. 9C, the transparent electrodes 10 are layered on the regions t. Subsequently, the same processes are conducted as shown in FIGS. 6D through 6E.

As manufactured above, it is not necessary to provide the insulation portion 40 independently on the substrate 9. Also, since the substrate corresponding to the luminescent region T is thin, the device becomes thin.

In the process of FIG. 9C in the above manufacturing method, the transparent electrodes 10 are provided at the regions t, that is, in the grooves formed in the substrate 9. However, all or a part of the organic layers 20 may be provided in the grooves. Thus, the insulation layers (the insulation portions 40) are provided at the outer periphery of the organic layers 20, so that the above advantageous effect is obtained.

Next, the action and the advantageous effects of the above organic EL element (the organic EL device) will be described. In the luminescent region provided at the electrical end of the organic EL element 1, the electrode that is not electrically connected to the electrode of the other luminescent region T is connected to an external drive circuit. When a voltage is applied to the organic EL element by the external drive circuit, the voltage is also applied to each luminescent region. In this case, since each luminescent region is serially connected to one another, the same amount of the electrical current flows in each luminescent region.

Also, the transparent regions are not connected to one another due to the insulation portions. Thus, there is extremely little possibility that there is the luminescent region in which electric current does not flow. Also, since the transparent electrodes are surrounded by the insulation portions, there is extremely little possibility that the anode and the cathode are short-circuited in each luminescent region.

As described above, substantially same amount of electric current flows in each luminescent region in the organic EL element according to the preferred embodiment. Thus, each luminescent region has substantially the same luminance and the same chromaticity, so that the above problems of the conventional techniques described in the BACKGROUND OF THE INVENTION are solved. Also, the above advantageous effects are achieved.

The insulation portion has the transmission function, the reflecting function or the scattering function. Thus, there is not substantially a position where light is not emitted in the light emitting surface. Namely, nonuniformity of luminance is extremely small, and the possibility (probability) of the existence of a non-emitting portion is extremely small, so that the organic EL element and the organic EL device are practically used.

The above preferred embodiment describes the organic EL element that emits light over its whole area and that is suitable for a light unit and a backlight. However, it is possible that the above organic EL element is applied to each pixel or each sub-pixel of an organic EL display that employs an active matrix mode or a passive matrix mode.

The present examples and embodiments are to be considered as illustrative and not restrictive, and the invention is not to be limited to the details given herein but may be modified within the scope of the appended claims.

What is claimed is:

1. An organic electroluminescent element comprising:
a plurality of luminescent regions each having a first electrode that is transparent and a second electrode that is opaque, each luminescent region having an organic layer that is sandwiched between the first electrode and the second electrode for emitting light, wherein the first electrodes are physically adjacently located; and
an insulation portion which is provided between the first electrodes and is in physical contact with the second electrode, wherein the plurality of luminescent regions are electrically and serially connected;
wherein the second electrode of one of the luminescent regions is electrically connected to the first electrode of the electrically adjacent luminescent region, and
wherein the insulation portion has a scattering means that scatters the light emitted from the organic layer.

2. The organic electroluminescent element according to claim 1, wherein the insulation portion is arranged so as to cover an end of the first electrode at a side where the second electrode is connected to the first electrode of the electrically adjacent luminescent region.

3. The organic electroluminescent element according to claim 1, wherein the luminescent regions that are electrically adjacent to one another are physically adjacent to one another.

4. The organic electroluminescent element according to claim 1, further comprising an insulation layer provided at the outer periphery of the organic layer for preventing the first electrode and the second electrode from being short-circuited.

5. The organic electroluminescent element according to claim 4, wherein the insulation portion serves as the insulation layer.

6. The organic electroluminescent element according to claim 1, wherein the organic layer of each luminescent region has substantially the same layer structure, each layer that constitutes the organic layer of each luminescent region containing substantially the same material as like layers in the other luminescent regions, a thickness of each layer constituting the organic layer of each luminescent region is substantially the same as those of the like layers in the other luminescent regions.

7. The organic electroluminescent element according to claim 1, wherein a thickness of the insulation portion is substantially the same as that of the first electrode.

8. An organic electroluminescent device comprising: a substrate having substantially a rectangular shape; and an organic electroluminescent element according to claim 1 provided on the substrate, wherein each luminescent region of the organic electroluminescent element is formed so as to have a rectangular shape having a side that is substantially parallel to a side of the substrate.

9. The organic electroluminescent element according to claim 1, wherein the scattering means is formed by minute beads, wherein the minute beads have a refraction index that is different from that of the insulation portion and are dispersed in the insulation portion.

10. The organic electroluminescent element according to claim 1, wherein the scattering means is formed by minute lens for scattering, wherein the lens are formed on the surface of the insulation portion by a fine processing method.

11. The organic electroluminescent element according to claim 1, wherein the scattering means is formed by dots for scattering, wherein the dots are formed on the surface of the insulation portion by a printing method.

* * * * *